United States Patent
Liu et al.

(10) Patent No.: US 11,223,013 B2
(45) Date of Patent: Jan. 11, 2022

(54) CONDUCTIVE BRIDGE SEMICONDUCTOR COMPONENT AND MANUFACTURING METHOD THEREFOR

(71) Applicant: INSTITUTE OF MICROELECTRONICS, CHINESE ACADEMY OF SCIENCES, Beijing (CN)

(72) Inventors: Qi Liu, Beijing (CN); Xiaolong Zhao, Beijing (CN); Sen Liu, Beijing (CN); Ming Liu, Beijing (CN); Hangbing Lv, Beijing (CN); Shibing Long, Beijing (CN); Yan Wang, Beijing (CN); Facai Wu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 126 days.

(21) Appl. No.: 16/489,266

(22) PCT Filed: Feb. 28, 2017

(86) PCT No.: PCT/CN2017/075141
§ 371 (c)(1),
(2) Date: Aug. 27, 2019

(87) PCT Pub. No.: WO2018/157279
PCT Pub. Date: Sep. 7, 2018

(65) Prior Publication Data
US 2020/0066984 A1    Feb. 27, 2020

(51) Int. Cl.
*H01L 45/00*  (2006.01)

(52) U.S. Cl.
CPC ........ *H01L 45/1246* (2013.01); *H01L 45/085* (2013.01); *H01L 45/1233* (2013.01);
(Continued)

(58) Field of Classification Search
CPC ............... H01L 45/1246; H01L 45/085; H01L 45/1233; H01L 45/1253; H01L 45/146;
(Continued)

(56) References Cited

U.S. PATENT DOCUMENTS

2014/0252296 A1 * 9/2014 Chueh ................. H01L 45/1246
257/3
2015/0291431 A1 * 10/2015 Tang ...................... H01G 11/36
361/508

(Continued)

FOREIGN PATENT DOCUMENTS

| CN | 105990519 | 10/2016 |
| DE | 102009054003 | 8/2010 |
| GB | 2501760 | 11/2013 |

OTHER PUBLICATIONS

International Search Report, issued in the corresponding PCT application No. PCT/CN2017/075141, dated Sep. 28, 2017, 6 pages.

*Primary Examiner* — Wasiul Haider
(74) *Attorney, Agent, or Firm* — Hamre, Schumann, Mueller & Larson, P.C.

(57) ABSTRACT

The present disclosure provides a conductive bridge semiconductor device and a method of manufacturing the same. The conductive bridge semiconductor device includes a lower electrode, a resistive switching functional layer, an ion barrier layer and an active upper electrode from bottom to top, wherein the ion barrier layer is provided with certain holes through which active conductive ions pass. Based on this structure, the precise designing of the holes on the barrier layer facilitates the modulation of the quantity, size and density of the conduction paths in the conductive bridge semiconductor device, which enables that the conductive bridge semiconductor device can be modulated to be a nonvolatile conductive bridge resistive random access memory or a volatile conductive bridge selector. Based on (Continued)

the above method, ultra-low power nonvolatile conductive bridge memory and high driving-current volatile conductive bridge selector with controllable polarity are completed.

15 Claims, 7 Drawing Sheets

(52) U.S. Cl.
CPC ........ H01L 45/1253 (2013.01); H01L 45/146 (2013.01); H01L 45/165 (2013.01)

(58) Field of Classification Search
CPC ....... H01L 45/165; H01L 45/16; H01L 45/00; H01L 27/11524; H01L 29/06
See application file for complete search history.

(56) References Cited

U.S. PATENT DOCUMENTS

2018/0212143 A1* 7/2018 Tseng ................... H01L 45/1608
2019/0376925 A1* 12/2019 Choi ................ G01N 33/48721

* cited by examiner

CONDUCTIVE BRIDGE SEMICONDUCTOR COMPONENT AND MANUFACTURING METHOD THEREFOR

CROSS-REFERENCE TO RELATED APPLICATION

This application is a US national phase application of the international application PCT/CN2017/075141, filed on Feb. 28, 2017, entitled "CONDUCTIVE BRIDGE SEMICONDUCTOR COMPENONT AND MANUFACTURING METHOD THEREFOR," which is incorporated herein by reference in its entirety.

TECHNICAL FIELD

The present disclosure relates to the field of memory technology in the microelectronics industry, and in particular, to a conductive bridge semiconductor device and a method of manufacturing the same.

BACKGROUND

With the continuous innovation of microelectronics and semiconductor technology, FLASH storage technology is facing a series of bottlenecks, for example, floating gates cannot be unrestricted thinning with the development of technology, data retention time is limited, operating voltage is too large and so on. Among many new types of memories, a resistive random access memory has now become the research focus of the new non-volatile memory due to its low operating power consumption, good endurance, simple structure and small device area, etc. If the conductive path can be maintained after the external bias is removed, the conductive bridge based device, acting as the non-volatile device, can be applied to the resistive random access memory; if the conductive path cannot be maintained after the external bias is removed, the conductive bridge based device, acting as the volatile device can be applied to the selector in the resistive random access memory cross array to eliminate read and write crosstalk caused by leakage channels in the cross array. However, the random formation of the conductive path of the non-volatile resistive random access memory greatly impairs the memory characteristics of the conductive bridge resistive random access memory, that is, the retention characteristics of the resistive state, and is not facilitated to the low power consumption characteristics of the device under low current limit.

At the same time, the cross array architecture based resistive random access memory has a problem of crosstalk in the read operation in the array, resulting in erroneous reading of the stored information. The most common solution to the problem of crosstalk is the choice of a selector integrated with a resistive random access memory, including a transistor with a RRAM (1T1R) structure, a unidirectional diode with a RRAM (1D1R) structure, and a bidirectional selector with a RRAM (1S1R) structure. The area of the memory cell in the 1T1R structure mainly depends on the area of the transistor, and it cannot take advantage of the excellent shrinkability of the RRAM; the diode in the 1T1R structure usually has only one-way conduction characteristics; the selector in the 1S1R structure is divided into two types. One type is an electronic type selector dominated by electronic conduction. This type of selector usually has a slowly changing electrical characteristic and a small selectivity ratio, and cannot provide a high operating current to the resistive random access memory. The other type is a conductive bridge selector dominated by an active metal conductive bridge. This type of selector is based on the fragile retention characteristics of the conductive bridge, and typically has an abrupt electrical characteristic and a high selectivity ratio. However, when this type of selector operates at a large operating current, the retention characteristics of the conductive bridge change, become not easily broken and become a non-volatile storage characteristic, and thus cannot perform strobing of the device.

SUMMARY OF THE DISCLOSURE

1. Technical Problems to be Solved

The present disclosure provides a conductive bridge semiconductor device and a method of manufacturing the same to at least partially solve the above-mentioned technical problems. Controlling the size, quantity and the density of the conductive filaments, the conductive bridge semiconductor device can be modulated to be a nonvolatile conductive bridge memory or a volatile conductive bridge selector.

2. Technical Solution

According to an aspect of the disclosure, there is provided a conductive bridge semiconductor device. The conductive bridge semiconductor device includes a lower electrode, a resistive switching functional layer, an ion barrier layer and an active upper electrode from bottom to top, wherein the ion barrier layer is provided with a hole through which active conductive ions pass.

Preferably, the conductive bridge device of the present disclosure can be modulated to be a conductive bridge resistive random access memory, and the number of holes in the ion barrier layer is one, and the radial size of the hole is between 5 nm and 200 nm.

Preferably, in the conductive bridge memory of the present disclosure, the hole is located at a central position of the ion barrier layer.

Preferably, in the conductive bridge memory of the present disclosure, the ion barrier layer is prepared by using a graphene material, and the radial size of the hole is between 5 nm and 100 nm.

Preferably, the conductive bridge device of the present disclosure can be modulated to be a conductive bridge selector, the number of holes in the ion barrier layer is greater than one, and the radial size of the holes is atomic scale and less than 5 nm.

Preferably, in the conductive bridge selector of the present disclosure, the holes are randomly distributed in the ion barrier layer, and the areal density is between $10^7/cm^2$ and $10^{14}/cm^2$.

Preferably, in the conductive bridge selector of the present disclosure, the ion barrier layer is prepared by using a graphene material, and the areal density of the hole is at $10^{10}/cm^2$ magnitude.

Preferably, in the conductive bridge device of the present disclosure, the shape of the hole is rectangular, elliptical, triangular, hexagonal or irregular figure.

Preferably, in the conductive bridge device of the present disclosure, the lower electrode is a layered structure prepared by one or more of the following materials: TaN, TiN, W, Al, Ru, Ti and Pt, and has a thickness between 10 nm and 200 nm; the resistive switching functional layer is a layered structure prepared by one or more of the following materials: $TaO_x$, MgO, $HfO_2$, $Al_2O_3$, $TiO_2$, $SiO_2$ and $ZrO_2$, and has a thickness between 3 nm and 100 nm; the ion barrier layer is made of at least one of the following materials: graphene, MoS$_2$, BN, Ti, TiW, Ta, TaSiN, TiN, TaN, CuSiN and the like, and has a thickness less than 10 nm; the active upper electrode uses a single-element electrode such as Ag, Cu, Ni or an alloy electrode containing at least one of those elements, and has a thickness between 10 nm and 200 nm.

According to another aspect of the present disclosure, there is also provided a method of manufacturing a conductive bridge device as described above. The manufacturing method comprises: sequentially forming a lower electrode, a resistive switching functional layer and an ion barrier layer; forming a hole in the ion barrier layer; and preparing an active upper electrode over the ion barrier layer having the hole.

Preferably, in the method of manufacturing the conductive bridge device of the present disclosure, the holes are formed in the ion barrier layer by optical exposure combined with focused high-energy ion beam etching.

Preferably, in the method of manufacturing the conductive bridge device as a memory of the present disclosure, the number of holes in the ion barrier layer is one; in the method of manufacturing the conductive bridge device as a selector of the present disclosure, the number of holes in the ion barrier layer is greater than one; and the holes are randomly distributed in the ion barrier layer, and the areal density is between $10^7$/cm$^2$ and $10^{14}$/cm$^2$.

Preferably, in the method of manufacturing the conductive bridge device of the present disclosure, the high energy ions for bombardment are obtained by an ion implanter or a particle accelerator. The energy is between 2 KeV and 200 KeV; the incident angle is between 80° and 100°; the dose is greater than $10^5$ ion/cm$^2$.

Preferably, in the method of manufacturing the conductive bridge device of the present disclosure, the material of the ion barrier layer is a graphene material, and the dose of the high energy ions for bombardment is between $10^{12}$ ion/cm$^2$ and $10^{14}$ ion/cm$^2$.

3. Advantageous Effects

It can be seen from the above technical solutions that the conductive bridge semiconductor device of the present disclosure and the method of manufacturing the same have at least one of the following advantageous effects:

(1) By introducing a hole-containing ion barrier layer, there is provided a novel conductive bridge semiconductor device structure including an active upper electrode/ion barrier layer containing hole(s)/resistive switching functional layer/lower electrode;

(2) Precise control of the ion barrier layer with different hole types, the quantity, size and density of the conductive filaments in the conductive bridge memory and selector can be well modulated;

(3) For the conductive bridge resistive random access memory, a single nano-scale hole may facilitate the concentrated distribution of the conductive paths, improve the retention characteristics of the resistive state, and realize the non-volatile resistive switching characteristics under a small operating current, thereby effectively reducing the power consumption of the conductive bridge resistive random access memory;

(4) For the conductive bridge selector, the array of holes in the ion barrier layer may facilitate the discrete distribution of the conductive paths, reduce the retention characteristics of the conductive paths, and realize the volatile resistive switching characteristics under the large operating current, thereby improving the drive current and selectivity ratio of the conductive bridge selector.

DESCRIPTION OF MAIN COMPONENT SYMBOLS IN THE EMBODIMENTS OF THE PRESENT DISCLOSURE IN FIGURES

10—lower electrode;
20—resistive switching functional layer;
40—active upper electrode;
30—ion barrier layer with a single hole; 31—single hole;
30'—ion barrier layer with an array of holes; 31', 32', 33'—holes;
CF—single conductive path; CF$_1$, CF$_2$, CF$_3$—multiple conductive paths.

DETAILED DESCRIPTION

The key to the implementation of the low-power conductive bridge resistive random access memory and the high-current conductive bridge selector function is to regulate the retention characteristics of the conductive bridge. Therefore, it is important to optimize the performance of the resistive random access memory and the selector based on the conductive bridge by regulating the retention characteristics of the conductive paths.

The disclosure introduces an ion barrier layer containing hole(s) on the basis of the active upper electrode/resistive switching functional layer/lower electrode structure to form a structure including an active upper electrode/ion barrier layer with hole(s)/resistive switching functional layer/lower electrode, and enables precise regulation of the conductive path(s) of the conductive bridge-based memory and the selector by regulating the quantity, size and density of the holes in the ion barrier layer.

The present disclosure will be further described in detail below in combination of the specific embodiments of the disclosure, with reference to the drawings, to make the purpose, technical solutions and advantages of the disclosure more apparent.

Figure 1A:
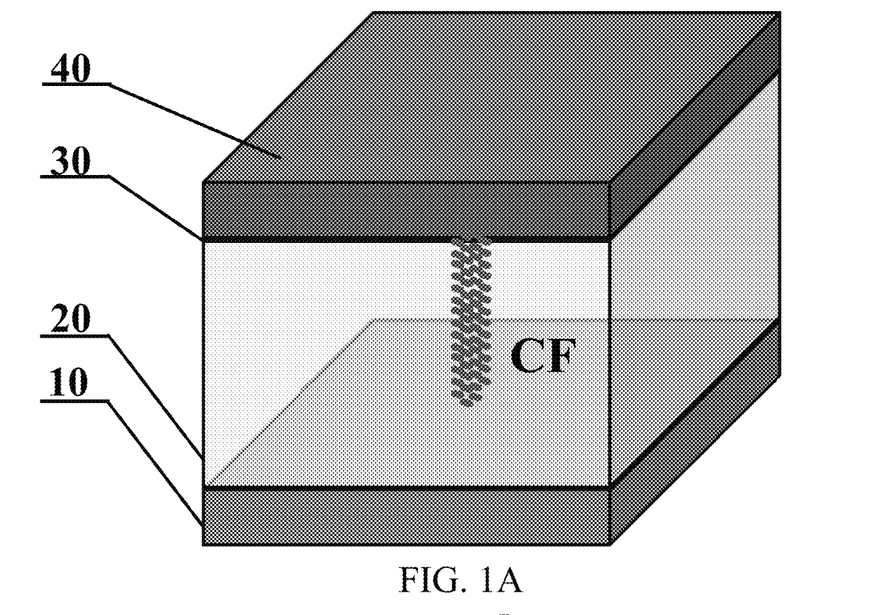
FIG. 1A is a schematic view showing the structure and conductive path regulation of a conductive bridge resistive random access memory with a single hole in an ion barrier layer according to a first embodiment of the present disclosure.
Figure 1B:
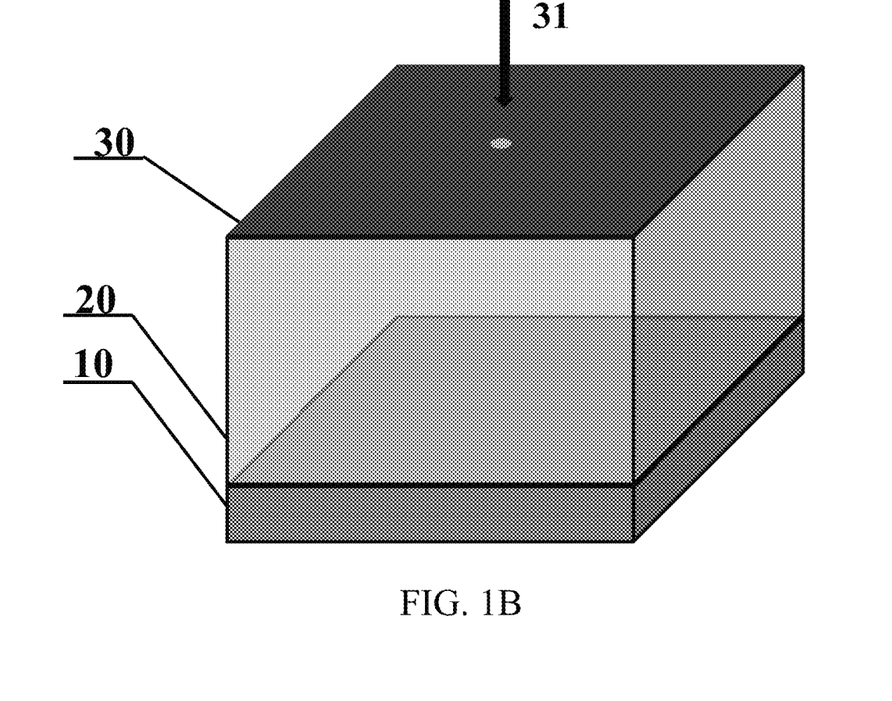
FIG. 1B is a schematic diagram of the single hole in the ion barrier layer of the conductive bridge resistive random access memory shown in FIG. 1A.

In a first exemplary embodiment of the present disclosure, a conductive bridge resistive random access memory is provided. FIG. 1A is a schematic view showing the structure and conductive path regulation of a conductive bridge resistive random access memory with a single hole in an ion barrier layer according to a first embodiment of the present disclosure. FIG. 1B is a schematic diagram of the single hole in the ion barrier layer of the conductive bridge resistive random access memory shown in FIG. 1A. As shown in FIG. 1A and FIG. 1B, the conductive bridge resistive random access memory includes sequentially a lower electrode 10, a resistive switching functional layer 20, an ion barrier layer 30 and an active upper electrode 40 from bottom to top. Wherein, the ion barrier layer is provided with a single hole 31 through which the active conductive ions pass.

The respective portions of the conductive bridge resistive random access memory of the present embodiment are described in detail below.

The lower electrode 10 may be prepared using one or more of the following materials, TaN, TiN, W, Al, Ru, Ti, and Pt. The thickness of the lower electrode 10 is between 10 nm and 200 nm.

The resistive switching functional layer 20 is a layered structure prepared by one or more of the following materials: $TaO_x$, MgO, $HfO_2$, $Al_2O_3$, $TiO_2$, $SiO_2$ and $ZrO_2$. The thickness of the resistive switching functional layer 30 is between 3 nm and 100 nm.

The ion barrier layer 30 is made of at least one of the following materials: graphene, $MoS_2$, BN, Ti TiW, Ta, TaSiN, TiN, TaN, CuSiN and the like. The thickness of the ion barrier layer 30 is less than 10 nm.

The active upper electrode 40 may utilize a single-element electrode such as Ag, Cu, Ni or an alloy electrode containing at least one of the listed elements. The thickness of the active upper electrode 40 is between 10 nm and 200 nm.

It will be apparent to those skilled in the art that the active upper electrode is not limited to the species listed above, and other electrodes capable of generating active conductive ions may be utilized. Also, the lower electrode is not limited to the species listed above, and electrodes made of other conductive materials may be utilized. Similarly, the resistive switching functional layer can be prepared using other materials having resistive switching properties. Also, the ion barrier layer is not limited to the species listed above, and it is possible to use a structurally dense film made of other materials.

In this embodiment, there is only one hole 31 in the ion barrier layer 30. The hole 31 is a nanometer-scale (5 nm to 200 nm) hole. For the conductive bridge resistive random access memory shown in FIG. 1A, the ion barrier layer with a single hole can facilitate the concentrated distribution of the conductive paths to form a single conduction path (Conduction filament, shortly regarded as CF), which enhances its resistive state retention characteristics, especially improves the resistive state retention characteristic of the conductive bridge resistive random access memory at a low current limit. This is beneficial to achieve stable and low power consumption operation of the device.

The shape of the hole in the ion barrier layer may be various, such as, a rectangle, a square, a circle, an ellipse, a triangle, a hexagon, and the like, and the radial size of the hole is between 5 nm and 100 nm. Preferably, the holes are preferably circular in view of the uniformity of current transport in various directions.

In this embodiment, a single hole in the ion barrier layer is preferably located at the center of the ion barrier layer, as shown in FIG. 1A. In this case, the single conduction path CF is positioned at the center of the ion barrier layer, which is more advantageous for device design and processing than positioned at the periphery.

Figure 2:
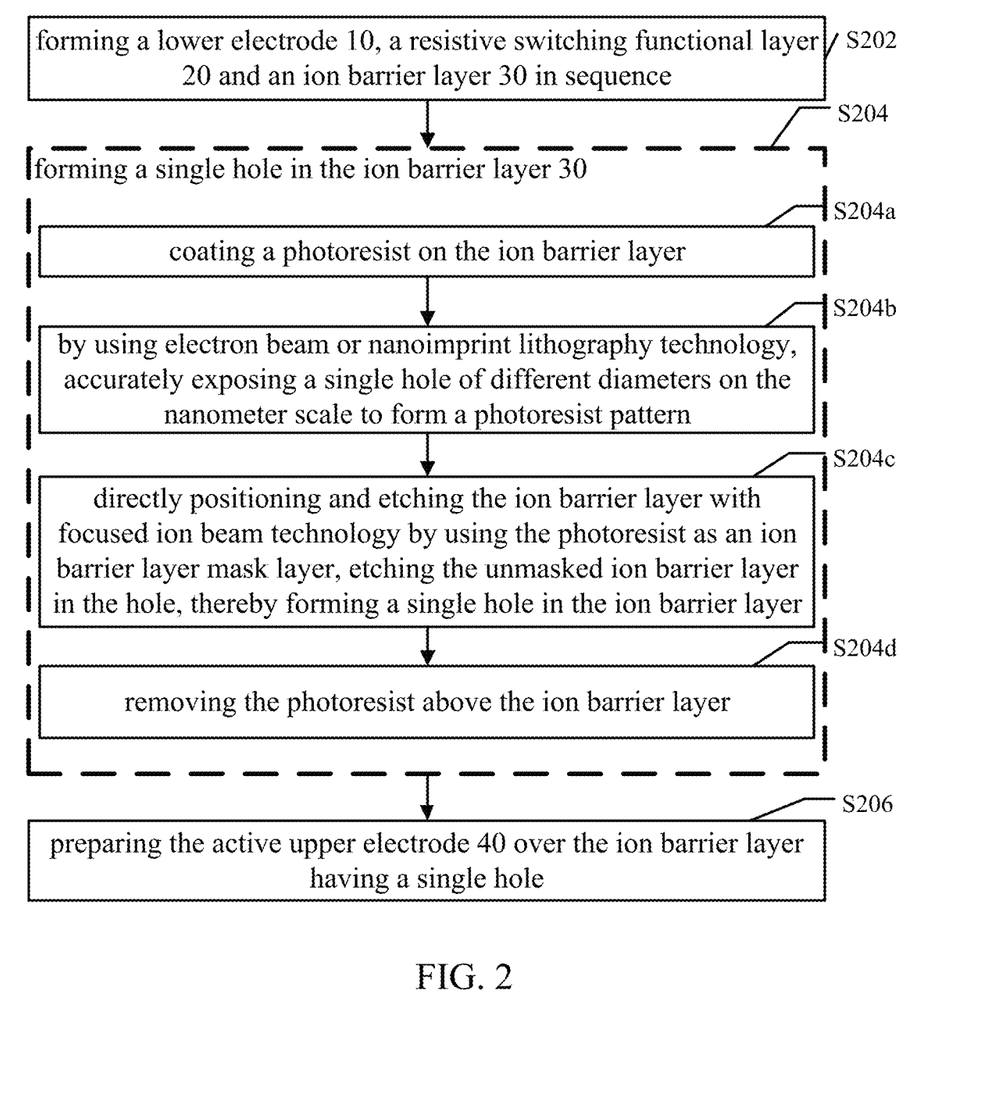
FIG. 2 is a flow chart of manufacturing the conductive bridge resistive random access memory of FIG. 1A in accordance with an embodiment of the present disclosure.

FIG. 2 is a flow chart of manufacturing the conductive bridge resistive random access memory of FIG. 1A in accordance with an embodiment of the present disclosure. Referring to FIG. 1A and FIG. 2, a method of manufacturing a conductive bridge resistive random access memory having a single hole in an ion barrier layer includes:

at Step S202, forming a lower electrode 10, a resistive switching functional layer 20 and an ion barrier layer 30 in sequence;

At Step S204, forming a single hole in the ion barrier layer 30;

The method for forming a single hole in the ion barrier layer 30 at this step includes:

at Sub-step S204a, coating a photoresist on the ion barrier layer;

at Sub-step S204b, by using electron beam or nanoimprint lithography technology, accurately exposing a single hole of different diameters on the nanometer scale to form a photoresist pattern;

at Sub-step S204c, directly positioning and etching the ion barrier layer with focused ion beam technology by using the photoresist as an ion barrier layer mask layer, etching the unmasked ion barrier layer in the hole, thereby forming a single hole in the ion barrier layer;

at Sub-step S204d, removing the photoresist above the ion barrier layer to obtain an ion barrier layer having a single hole, and step S204 is completed.

at Step S206, preparing the active upper electrode 40 over the ion barrier layer having a single hole, and thus, the manufacture of the conductive bridge resistive random access memory having a single hole in the ion barrier layer as shown in FIG. 1A is completed.

In order to highlight the effect of the ion barrier layer with a single hole on the performance of the conductive bridge resistive random access memory, performance tests were performed on a conventional resistive random access memory and a conductive bridge resistive random access memory manufactured in accordance with an embodiment of the present disclosure.

Figure 3:
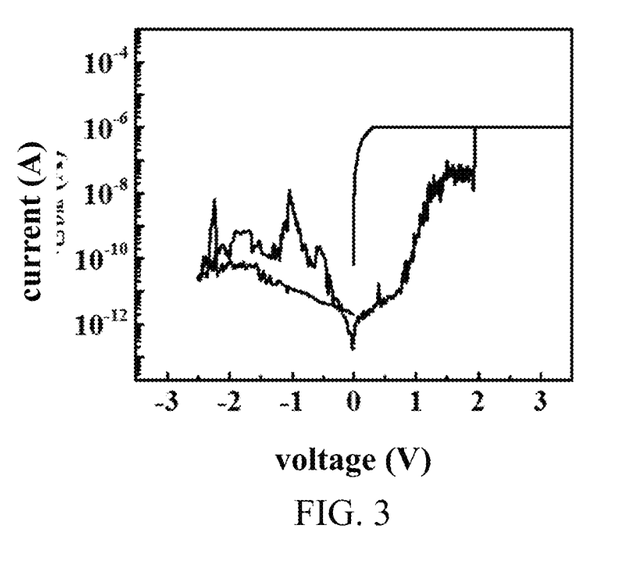
FIG. 3 and FIG. 4 are respectively a characteristic I-V curve, at 1 µA, of a conventional Cu/HfO$_2$/Pt device and a Cu/single-hole graphene/HfO$_2$/Pt device manufactured according to the first embodiment of the present disclosure.
Figure 4:
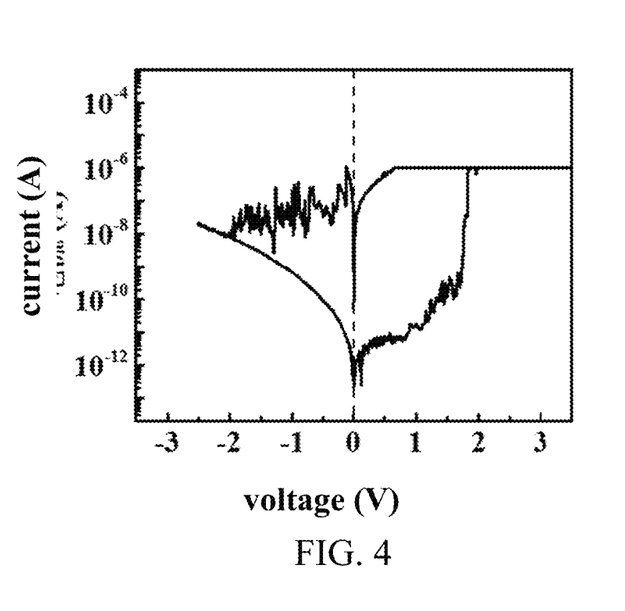

FIG. 3 and FIG. 4 are respectively a characteristic I-V curve, at 1 µA, of a conventional $Cu/HfO_2/Pt$ device and a Cu/single-hole graphene/$HfO_2$/Pt device manufactured according to the first embodiment of the present disclosure.

In the Cu/single-hole graphene/HfO$_2$/Pt device, the single hole diameter of the graphene is between 5 nm and 100 nm.

It can be seen from FIG. 3 and FIG. 4 that the Cu/HfO$_2$/Pt device without graphene barrier layer exhibits volatile characteristics at a current limit of 1 µA, while Cu/single hole graphene/HfO$_2$/Pt device exhibits non-volatile characteristics at this current limit.

Figure 5A:
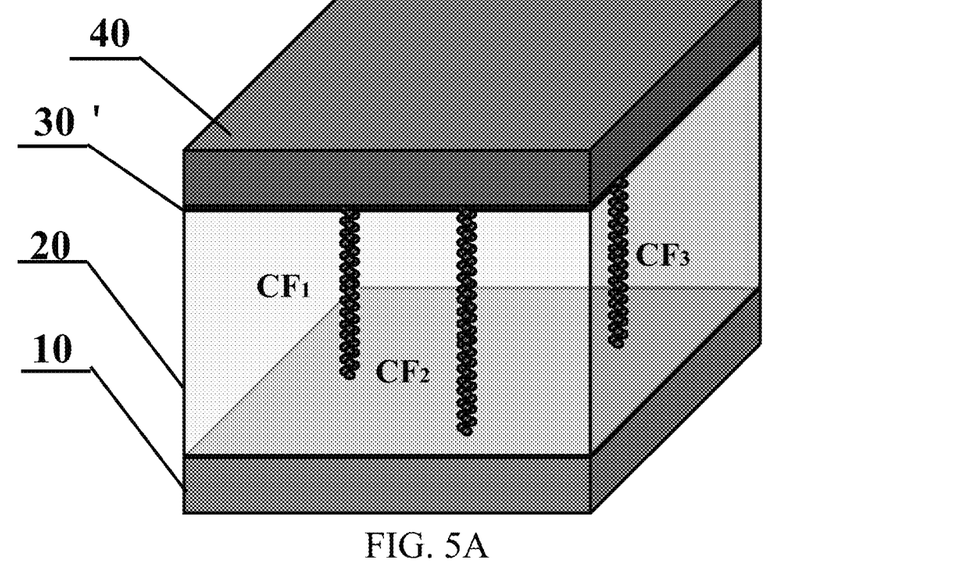
FIG. 5A is a schematic diagram showing the structure and conductive path regulation of a conductive bridge selector having an ion barrier layer with an array of holes thereon according to a second embodiment of the present disclosure.
Figure 5B:
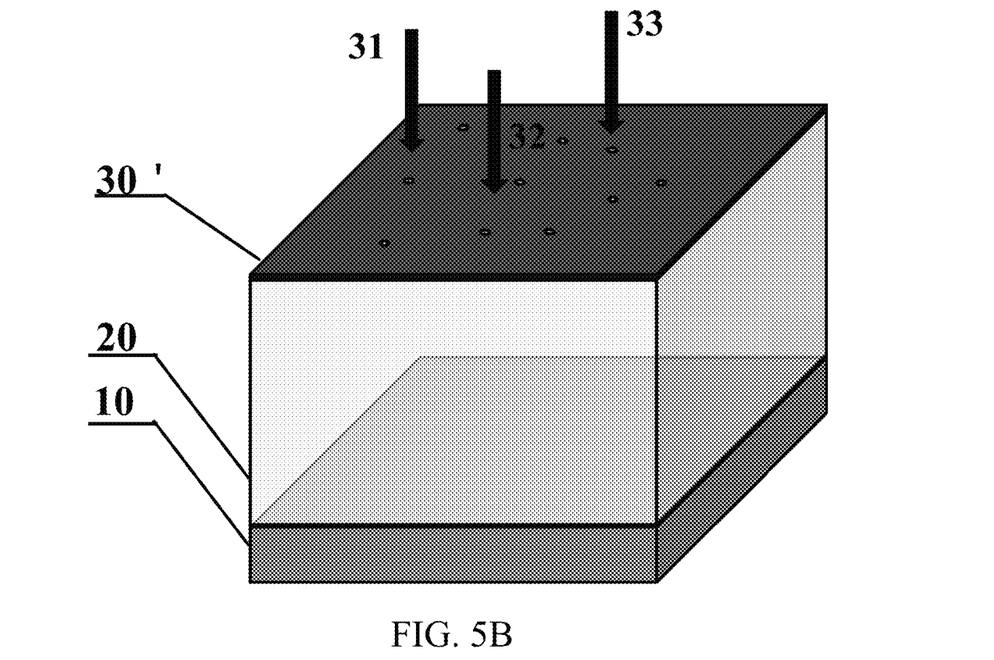
FIG. 5B is a schematic diagram of an array of holes in the ion barrier layer of the conductive bridge selector shown in FIG. 5A.

In another exemplary embodiment of the present disclosure, a conductive bridge selector is also provided. FIG. 5A is a schematic diagram showing the structure and conduction path regulation of a conductive bridge selector having an array of holes in an ion barrier layer according to an embodiment of the present disclosure. FIG. 5B is a schematic diagram of an array of holes in the ion barrier layer of the conductive bridge selector shown in FIG. 5A. As shown in FIG. 5A and FIG. 5B, the difference between this embodiment and the previous embodiment is that the ion barrier layer 30' has a plurality of holes (31', 32', 33', etc.) of atomic scale (less than 5 nm), thus forming an array of holes.

As shown in FIG. 5A, for the ion barrier layer with the formed hole array, the conduction path can be discretely distributed to form a plurality of conduction paths (CF$_1$, CF$_2$, CF$_3$, etc.), thereby greatly weakening its retention characteristics, increasing the maximum current that the conductive bridge selector can provide, and improving its driving ability and selection ratio.

Preferably, if the holes in the ion barrier layer 20 are porous, the multiple holes follow a random distribution in the ion barrier layer with an areal density between 10$^7$/cm$^2$ and 10$^{14}$/cm$^2$. This setting is mainly to avoid excessive concentration of conductive paths and improve the response speed of the selector. It is verified by experiments that when the areal density of the graphene holes is at 10$^{10}$/cm$^2$ magnitude, the response speed of the device is faster, and the switching speed is within 1 µs.

The method of manufacturing the conductive bridge selector having a plurality of holes in the ion barrier layer is similar to the method of manufacturing the conductive bridge resistive random access memory having a single hole in the ion barrier layer shown in FIG. 2A, and the difference is that in the method of manufacturing the multiple holes in the ion barrier layer, and the following two specific methods of manufacturing the multiple holes are provided:

(1) forming an array of a plurality of holes in the ion barrier layer by using a lithographic exposure plus ion beam etching method similar to the sub-steps S204a to S204d;

(2) forming a porous ion barrier layer having a regulatable diameter and density by high-energy ions accelerated by an ion implanter or a particle accelerator directly bombarding the ion barrier layer, and by controlling the bombardment energy and dose. Within a certain range, the aperture size of the hole is mainly determined by the energy of the bombarding ions and the angle of incidence, and the density of the holes is mainly determined by the dose of the bombarding ions.

Preferably, during ion bombardment, the energy of the bombarding ions is between 2 KeV and 200 KeV, the incident angle is between 80° and 100°, and the dose is greater than 10$^5$ ion/cm$^2$.

The aperture of the hole formed by the ion bombardment method is at the atomic scale, and this type of graphene defect can be characterized by testing Raman spectroscopy.

Figure 6:
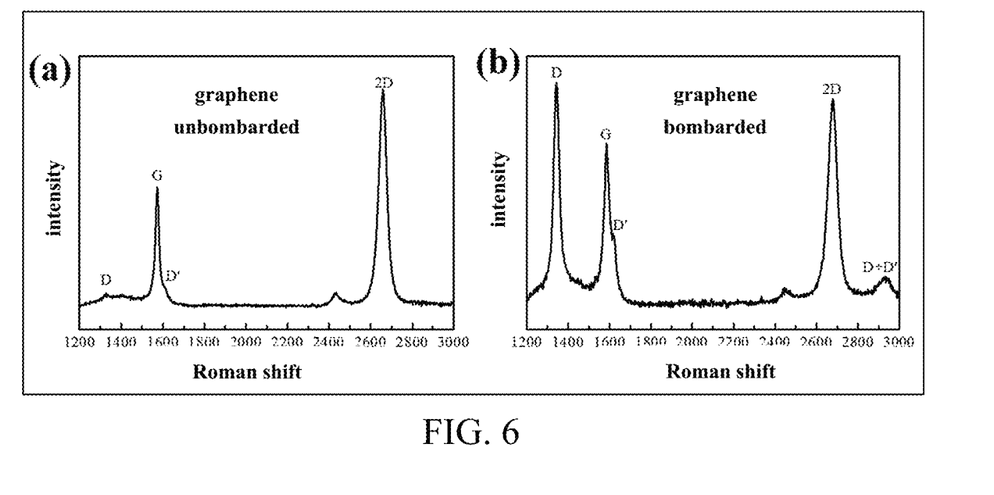
FIG. 6 is Raman spectroscopy diagrams of unprocessed graphene and graphene being bombarded by ions at a certain condition.

FIG. 6 is Raman spectroscopy diagrams of unprocessed graphene and graphene being bombarded by ions at a certain condition. In FIG. 6, the G peak is a characteristic peak of the C sp$^2$ structure, reflecting the symmetry and the degree of crystallization, and the 2D peak is a two-phonon inelastic scattering peak. The D peak, the D' peak and the D+D' peak are Raman peaks associated with graphene defects. It can be seen from FIGS. 6(a) and (b) that after the particle bombardment, the relative ratio between the peaks changes greatly, and the intensity ratio I$_D$/I$_G$ of the D peak to the G peak can be used to qualitatively measure the average distance L$_D$ of defects and the density σ of the defects. The relationship is as follows: $I_D/I_G \propto 1/L^2_D \propto \sigma$. The porous ion barrier layer is mainly used to disperse the conduction paths, weaken its retention characteristics, increase the maximum current that the conductive bridge selector can provide, and increase the selection ratio.

To highlight the effect of the porous ion barrier layer on the performance of the conductive bridge selector, an Ag/porous graphene/SiO$_2$/Pt device is manufactured. An ion implanter is used with Si as the bombarding ion source, an implantation energy of 10 KeV and implantation doses of D1, D2, and D3 (D1<D2<D3), where D1=10$^{12}$ ion/cm$^2$; D2=5×10$^{12}$ ion/cm$^2$; D3=10$^{13}$ ion/cm$^2$, thereby obtaining the Ag/porous graphene/SiO$_2$/Pt devices with three different hole densities of graphene.

Figure 7:
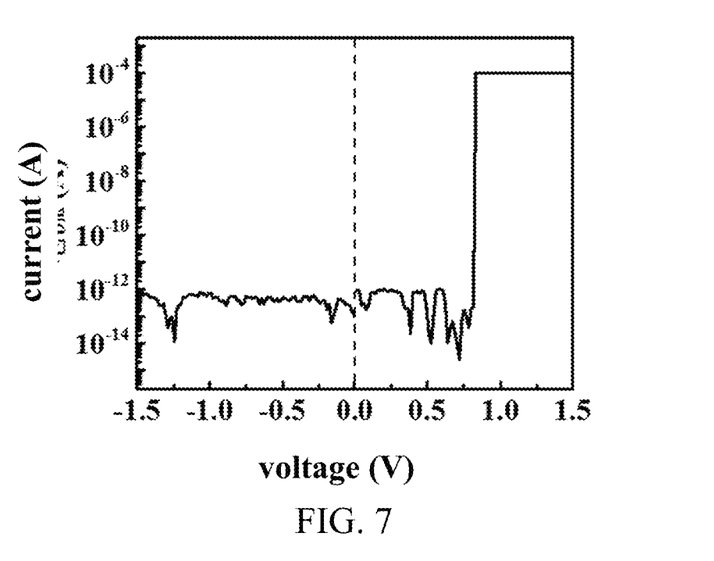
FIG. 7 and FIG. 8 respectively show a characteristic I-V curve, at the maximum volatile current limit of 100 µA, of an Ag/porous graphene/SiO$_2$/Pt device when multiple holes are formed in the ion barrier layer with the implantation dose of D1, D2.
Figure 8:
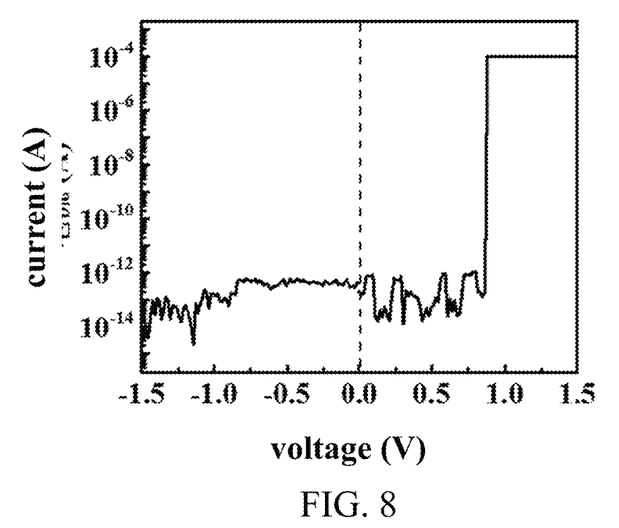

FIG. 7 and FIG. 8 show the characteristic I-V curves, at the maximum volatile current limit of 100 µA, of Ag/porous graphene/SiO$_2$/Pt devices with an implantation dose of D1, D2. It can be seen that the Ag/porous graphene/SiO$_2$/Pt devices with the two doses exhibit unipolar characteristics and can therefore be used as unipolar conductive bridge selectors.

Figure 9:
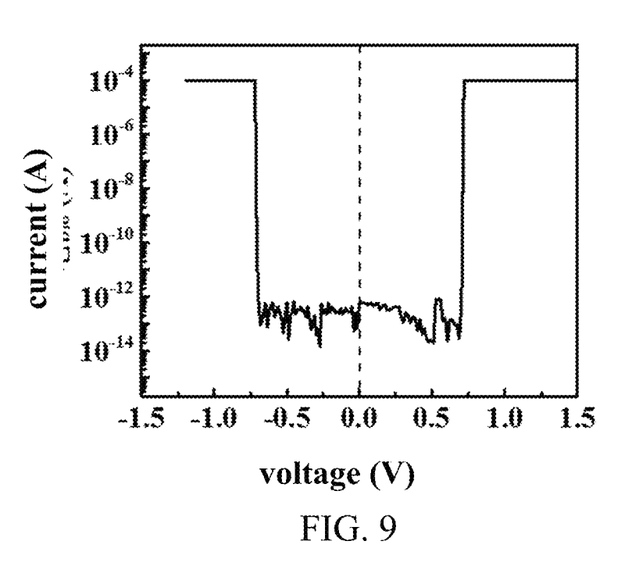
FIG. 9 is a characteristic I-V curve, at a current limit of 100 µA, of an Ag/porous graphene/SiO$_2$/Pt device when multiple holes are formed in the ion barrier layer with the implantation dose being increased to D3.

FIG. 9 is a characteristic I-V curve, at a current limit of 100 µA, of an Ag/porous graphene/SiO$_2$/Pt device when the implantation dose is increased to D3. As shown in FIG. 9, the Ag/porous graphene/SiO$_2$/Pt device transits from unipolar to bipolar as the implantation dose is increased to D3. As the implantation dose increases, more active metal ions enter the resistive switching functional layer to form a conduction path and accumulate at the lower electrode, which also results in a unipolar to bipolar transition.

Figure 10:
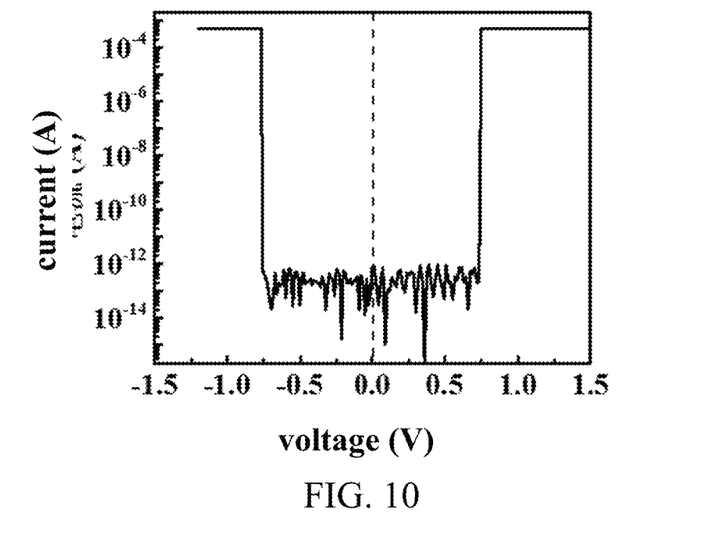
FIG. 10 is a characteristic I-V curve, at a maximum volatile current limit of 500 µA, of the Ag/porous graphene/SiO$_2$/Pt device when multiple holes are formed in the ion barrier layer with the implantation dose being increased to D3.

FIG. 10 is a characteristic I-V curve, at a maximum volatile current limit of 500 µA, of the Ag/porous graphene/SiO$_2$/Pt device when the implantation dose is increased to D3. It can be seen that the Ag/porous graphene/SiO$_2$/Pt device still maintains the bidirectional volatile property at a higher current limit of 500 µA.

It can be seen that, in the conductive bridge selector shown in FIG. 5B, the porous ion barrier layer can indeed disperse the conduction path, weaken its retention characteristics, increase the maximum current that the conductive bridge selector can provide, and increase the selection ratio. The Ag/porous graphite/SiO$_2$/Pt device reaches a maximum volatile current limit of 500 µA and the selection ratio of 5×10$^8$ at the dose of D3.

Further, in order to test the effect of the conductive bridge selector of the Ag/porous graphene/SiO$_2$/Pt in the present embodiment, the Ag/porous graphene/SiO$_2$/Pt device is connected in series with the Cu/HfO$_2$/Pt device through a peripheral circuit.

Figure 11:
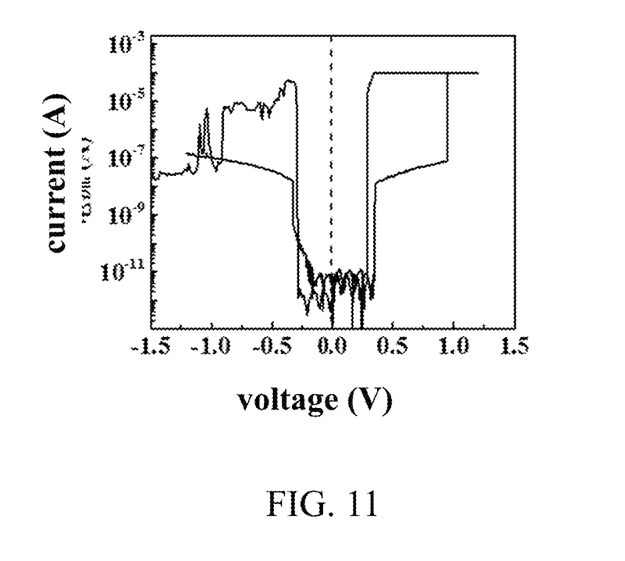
FIG. 11 is a characteristic I-V curve obtained by testing an Ag/porous graphene/SiO$_2$/Pt selector device connected in series with a Cu/HfO$_2$/Pt memory device through a peripheral circuit.

FIG. 11 is a characteristic I-V curve obtained by testing an Ag/porous graphene/SiO$_2$/Pt device connected in series with a Cu/HfO$_2$/Pt device through a peripheral circuit. The characteristic I-V curve shows that the selector of the Ag/porous graphene/SiO$_2$/Pt has a good selection effect, and the selection ratio reaches 10$^8$.

For the purpose of brief description, any of the technical features of the above-described first embodiment that can be used for the same application will be incorporated herein, and the same description will not be repeated.

So far, the conductive bridge selector in the second embodiment of the present disclosure has been described.

It will be apparent to those skilled in the art that in addition to the conductive bridge resistive random access memory and the conductive bridge selector, other semiconductor devices employing the conductive bridge principle are still applicable to the present disclosure and will not be described herein.

It should be noted that the implementations that are not shown or described in the drawings or the text of the specification are all known to those of ordinary skill in the art and are not described in detail. In addition, the above definitions of the various elements and methods are not limited to the specific structures, shapes, dimensions or manners mentioned in the embodiments, and those skilled in the art can simply modify or replace them, for example:

(1) The lower electrode may also be in the form of a conductive oxide such as ITO;

(2) The resistive switching functional layer can be replaced by a novel two-dimensional material such as BN, $MoS_x$, graphene oxide or the like.

Heretofore, the embodiments of the present disclosure have been described in detail in conjunction with the accompanying drawings. Based on the above description, those skilled in the art should have a clear understanding of the conductive bridge semiconductor device of the present disclosure and the method of manufacturing the same.

In summary, the present disclosure provides a conductive bridge semiconductor device with a structure of an active upper electrode/hole-containing ion barrier layer/resistive switching functional layer/lower electrode, by regulating the diameter, number and density of holes in the ion barrier layer, regulation of the size and number of conduction paths of the conductive bridge-based memory and selector can be achieved as follows:

(1) forming a single nanometer-scale hole in the ion barrier layer can facilitate the concentrated distribution of the conduction paths, improve the resistance state retention characteristic, and realize the non-volatile resistive switching characteristic under a small operating current, thereby effectively reducing the power consumption of the conductive bridge resistive random access memory;

(2) forming a plurality of atomic-scale holes in the ion barrier layer can facilitate the discrete distribution of the conduction paths, reduce the retention characteristics of the conduction paths, and realize the volatile resistive switching characteristics under a large operating current, thereby improving the drive current and selection ratio of the conductive bridge selector.

The conductive bridge semiconductor device and the method of manufacturing the same in the present disclosure have the advantages of high performance, easy integration, low cost, and the like, and have good application prospects.

It should also be noted that an example of parameters containing specific values may be provided herein, but these parameters need not be exactly equal to the corresponding values, but may approximate the corresponding values within acceptable error tolerances or design constraints. The directional terms mentioned in the embodiments, such as "upper", "lower", "front", "back", "left", "right", etc., are merely referring to the directions of the drawings, and are not intended to limit the scope of the disclosure. In addition, the order of the above steps is not limited to the above, and may be varied or rearranged depending on the desired design, unless specifically described or necessarily occurring in sequence. The above embodiments may be used in combination with each other or with other embodiments based on design and reliability considerations, that is, the technical features in different embodiments may be freely combined to form more embodiments.

It should be noted that the same elements are denoted by the same or similar reference numerals throughout the drawings. In the following description, some specific embodiments are for illustrative purposes and are not to be construed as limiting the disclosure, and may be only an example of the present embodiment. Conventional structures or configurations will be omitted when it may cause confusion to the understanding of the present disclosure. It should be noted that the shapes and sizes of the various components in the drawings do not reflect the true size and proportions, but merely illustrate the contents of the embodiments of the present disclosure.

The purpose, technical solutions and advantageous effects of the disclosure have been described in detail in the above specific embodiments. It is to be understood that those are only specific embodiments of the present disclosure but not intended to limit the present disclosure. Any modifications, equivalent substitutions, improvements, etc., made within the spirit and scope of the present disclosure are intended to be included within the scope of the present disclosure.

We claim:

1. A conductive bridge semiconductor device, comprising a lower electrode, a resistive switching functional layer, an ion barrier layer and an active upper electrode from bottom to top, wherein the ion barrier layer is provided with certain holes through which active conductive ions pass, and wherein the ion barrier layer is directly connected to the active upper electrode.

2. The conductive bridge semiconductor device according to claim 1, wherein the conductive bridge semiconductor device is a conductive bridge resistive random access memory, the number of holes in the ion barrier layer is one, and a radial size of the hole is between 5 nm and 200 nm.

3. The conductive bridge semiconductor device according to claim 2, wherein the hole is located at a central position of the ion barrier layer.

4. The conductive bridge semiconductor device according to claim 2, wherein the ion barrier layer is made of at least one of the following materials: graphene, $MoS_2$, BN, Ti, TiW, Ta, TaSiN, TiN, TaN, CuSiN and the like, and the radial size of the hole is between 5 nm and 100 nm.

5. The conductive bridge semiconductor device according to claim 1, wherein the conductive bridge semiconductor device is a conductive bridge selector, the number of holes in the ion barrier layer is greater than one, and the radial size of the hole is atomic scale and less than 5 nm.

6. The conductive bridge semiconductor device according to claim 5, wherein the holes are randomly distributed in the ion barrier layer with an areal density between $10^7/cm^2$ and $10^{14}/cm^2$.

7. The conductive bridge semiconductor device according to claim 6, wherein the ion barrier layer is made of at least one of the following materials: graphene, $MoS_2$, BN, Ti, TiW, Ta, TaSiN, TiN, TaN, CuSiN and the like, and the areal density of the holes is among $10^7/cm^2 \sim 10^{14}/cm^2$.

8. The conductive bridge semiconductor device according to claim 6, wherein an increase of the areal density of the holes on the ion barrier layer results in a unipolar to bipolar transition of the device.

9. The conductive bridge semiconductor device according to claim 1, wherein a shape of each of the holes is rectangular, elliptical, triangular, hexagonal, or irregular figure.

10. The conductive bridge semiconductor device according to claim 1, wherein the lower electrode is a layered structure prepared by one or more of following materials:

TaN, TiN, W, Al, Ru, Ti, and Pt, and has a thickness between 10 nm and 200 nm;

the resistive switching functional layer is a layered structure prepared by one or more of following materials: $TaO_x$, MgO, $HfO_2$, $Al_2O_3$, $TiO_2$, $SiO_2$ and $ZrO_2$, and has a thickness between 3 nm and 100 nm;

the ion barrier layer is made of at least one of the following materials: graphene, $MoS_2$, BN, Ti, TiW, Ta, TaSiN, TiN, TaN, CuSiN and the like, and has a thickness less than 10 nm;

the active upper electrode comprises a single-element electrode including Ag, Cu or Ni, or an alloy electrode including at least one of Ag, Cu or Ni, and has a thickness between 10 nm and 200 nm.

11. A method of manufacturing the conductive bridge semiconductor device according to claim 1, comprising:

forming the lower electrode, the resistive switching functional layer and the ion barrier layer in sequence;

forming the holes in the ion barrier layer; and preparing the active upper electrode over the ion barrier layer having the holes.

12. The method according to claim 11, wherein the holes are formed in the ion barrier layer by using optical exposure combined with focused ion beam etching.

13. The method according to claim 11, wherein when the number of holes in the ion barrier layer is one, the conductive bridge device is a memory; when the number of holes in the ion barrier layer is larger than one, the conductive bridge device is a selector, the holes are randomly distributed in the ion barrier layer, and an areal density of the holes is between $10^7/cm^2$ and $10^{14}/cm^2$.

14. The method according to claim 13, wherein high energy ions for bombardment are obtained by an ion implanter or a particle accelerator, with an energy between 2 KeV and 200 KeV, an incident angle between 80° and 100°, and a dose greater than $10^5$ $ion/cm^2$.

15. The method according to claim 13, wherein a dose of high energy ions for bombardment is between $10^{12}$ ion/cm2 and $10^{14}$ ion/cm2.

* * * * *